(12) United States Patent
He et al.

(10) Patent No.: US 9,666,709 B2
(45) Date of Patent: May 30, 2017

(54) NON-PLANAR SEMICONDUCTOR STRUCTURE WITH PRESERVED ISOLATION REGION

(71) Applicant: GLOBALFOUNDRIES Inc., Grand Cayman (KY)

(72) Inventors: Xiaoli He, Ballston Lake, NY (US); Yanxiang Liu, Glenville, NY (US); Jerome Ciavatti, Hopewell Junction, NY (US); Myung Hee Nam, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/609,105

(22) Filed: Jan. 29, 2015

(65) Prior Publication Data

US 2016/0225895 A1    Aug. 4, 2016

(51) Int. Cl.
*H01L 29/78*  (2006.01)
*H01L 29/10*  (2006.01)
*H01L 29/06*  (2006.01)
*H01L 29/08*  (2006.01)
*H01L 29/417*  (2006.01)
(Continued)

(52) U.S. Cl.
CPC ...... *H01L 29/7816* (2013.01); *H01L 21/0332* (2013.01); *H01L 21/32* (2013.01); *H01L 29/0653* (2013.01); *H01L 29/0882* (2013.01); *H01L 29/1037* (2013.01);
(Continued)

(58) Field of Classification Search
CPC ............. H01L 29/7816; H01L 29/0882; H01L 29/66681; H01L 29/0653; H01L 29/66545; H01L 29/1037; H01L 21/31144; H01L 29/41775
See application file for complete search history.

(56) References Cited

U.S. PATENT DOCUMENTS 6,333,234 B1 * 12/2001 Liu .................. H01L 29/78612
257/E29.278
8,030,708 B2 * 10/2011 Tateshita .......... H01L 21/28114
257/213

(Continued)

OTHER PUBLICATIONS

Chen, et al., "On-Resistance Degradation Induced by Hot-Carrier Injection in LDMOS Transistors With STI in the Drift Region," IEEE Electron Device Letters, vol. 29, No. 9, Sep. 2008, pp. 1071-1073.

*Primary Examiner* — Jarrett Stark
(74) *Attorney, Agent, or Firm* — Wayne F. Reinke, Esq.; Heslin Rothenberg Farley & Mesiti P.C.

(57) ABSTRACT

A non-planar semiconductor structure includes a semiconductor substrate, multiple raised semiconductor structures coupled to the substrate, a drain well in each of the raised structures, and a drain in each drain well. The structure further includes an isolation region in each drain well adjacent the drain, each isolation region reaching to a top surface of the corresponding raised structure, and a conductive center gate on each raised structure, the conductive center gate covering a top surface, a front surface and a back surface thereof, and covering a portion of the isolation region opposite the drain. The isolation regions in the drain wells reaching to the raised structure top surface is a result of preserving the isolation region by covering it during fabrication with an HDP oxide to prevent partial removal.

7 Claims, 3 Drawing Sheets

(51) Int. Cl.
    *H01L 29/66*     (2006.01)
    *H01L 29/739*     (2006.01)
    *H01L 21/033*     (2006.01)
    *H01L 21/32*     (2006.01)

(52) U.S. Cl.
    CPC .. *H01L 29/41775* (2013.01); *H01L 29/66545* (2013.01); *H01L 29/66681* (2013.01); *H01L 29/7391* (2013.01)

(56) References Cited

U.S. PATENT DOCUMENTS

| | | | |
|---|---|---|---|
| 9,082,852 B1* | 7/2015 | Liu | H01L 29/785 |
| 2001/0003056 A1* | 6/2001 | Hashimoto | H01L 21/28052 |
| | | | 438/592 |
| 2004/0188797 A1* | 9/2004 | Khater | H01L 29/66242 |
| | | | 257/510 |
| 2010/0117150 A1* | 5/2010 | Pendharkar | H01L 21/823814 |
| | | | 257/337 |
| 2011/0049620 A1* | 3/2011 | Chen | H01L 29/0856 |
| | | | 257/336 |
| 2012/0175724 A1* | 7/2012 | Haynie | H01L 29/0619 |
| | | | 257/484 |
| 2013/0049115 A1* | 2/2013 | Cheng | H01L 29/66803 |
| | | | 257/347 |
| 2013/0175615 A1* | 7/2013 | Uhlig | H01L 21/823814 |
| | | | 257/339 |
| 2014/0183628 A1* | 7/2014 | Ito | H01L 29/7816 |
| | | | 257/335 |
| 2016/0005640 A1* | 1/2016 | Shinohara | H01L 21/76224 |
| | | | 438/425 |

\* cited by examiner

NON-PLANAR SEMICONDUCTOR STRUCTURE WITH PRESERVED ISOLATION REGION

BACKGROUND OF THE INVENTION

Technical Field

The present invention generally relates to semiconductor structures with an isolation region under the gate. More particularly, the present invention relates to non-planar semiconductor structures with an isolation region separating the gate from the drain.

Background Information

Non-planar semiconductor devices in high-voltage applications can sustain damage to isolation material in a region under the conductive gate, separating the gate and the drain. Currently, such isolation regions are recessed, allowing the conductive gate to "wrap" around the fin on that side. However, while wrapping the gate around the fin generally is the implementation of current non-planar art, such wrapping near the drain can induce a high local electric field that can degrade the oxide under the gate.

Therefore, a need exists for a way to reduce or eliminate degradation of the gate oxide due to the high local electric field.

SUMMARY OF THE INVENTION

The shortcomings of the prior art are overcome and additional advantages are provided through the provision, in one aspect, of a non-planar semiconductor structure. The structure includes a semiconductor substrate, at least one fin coupled to the substrate, a drain well in each of the at least one fin, and a drain within each drain well, a top surface of the drain being coplanar with a top surface of the at least one fin. The structure further includes an isolation region in each drain well horizontally adjacent the drain, a top surface of the isolation region being coplanar with a top surface of the drain, a conductive center gate on the at least one fin, the conductive center gate covering a top surface, a front surface and a back surface thereof, and covering a portion of the isolation region opposite the drain, and an edge gate covering an outer vertical edge of each drain.

In accordance with another aspect, a non-planar semiconductor structure, is provided. The structure includes a semiconductor substrate, at least one fin coupled to the substrate, a drain within each drain well, a top surface of the drain being coplanar with a top surface of the at least one fin, and an isolation region in each drain well, horizontally adjacent the drain, a top surface of the isolation region being coplanar with a top surface of the drain. The structure further includes a layer of hard mask material over the at least one fin, the layer of hard mask material having an opening therein above each isolation region.

In accordance with yet another aspect, a method is provided. The method includes providing a starting non-planar semiconductor structure. The starting structure includes a semiconductor substrate, at least one fin coupled to the substrate, at least one drain well in each of the at least one fin, and an isolation region in each drain well, each isolation region reaching to a top surface of the at least one fin. The method further includes preserving the isolation region in each drain well, creating a drain in each drain well adjacent to the isolation region, and creating a conductive center gate covering a portion of the at least one fin opposite the drain.

These, and other objects, features and advantages of this invention will become apparent from the following detailed description of the various aspects of the invention taken in conjunction with the accompanying drawings.

DETAILED DESCRIPTION OF THE INVENTION

Figure 1:
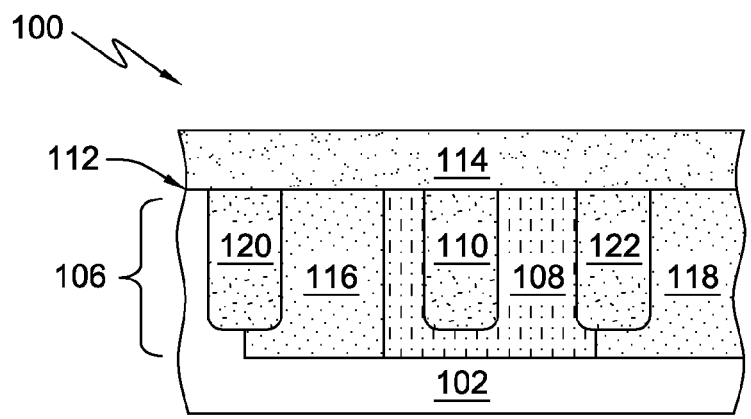
FIG. 1 is a cross-sectional view of one example of a non-planar starting semiconductor structure, the starting structure including a semiconductor substrate, one or more raised semiconductor structures coupled to the substrate, a drain well in each raised structure, an isolation region in each drain well reaching to a top surface of the raised structure, and a blanket layer of hard mask material over the starting structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a non-planar starting semiconductor structure 100, the starting structure including a semiconductor substrate 102, one or more raised semiconductor structures 106 coupled to the substrate (raised structure 106 shown in FIG. 1 cross-section), a drain well (e.g., drain well 108) in each raised structure, an isolation region (e.g., isolation region 110) in each drain well reaching to a top surface 112 of the raised structure, and a blanket layer 114 of hard mask material over the starting structure, in accordance with one or more aspects of the present invention. Though not critical for the invention, also shown are source wells 116 and 118 of a type (n-type or p-type) opposite the drain well, and isolation regions 120 and 122.

The starting structure may be conventionally fabricated, for example, using known processes and techniques. However, it will be understood that the fabrication of the starting structure forms no part of the present invention. Further, although only a portion is shown for simplicity, it will be understood that, in practice, many such structures (e.g., multiple raised structures) are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, the raised structure(s) 106 (raised with respect to the substrate) may take the form of a "fin." The raised structure(s) may be etched from a bulk substrate, and may include, for example, any of the materials listed above with respect to the substrate. Further, some or all of the raised structure(s) may include added impurities (e.g., by doping), making them n-type or p-type.

Figure 2:
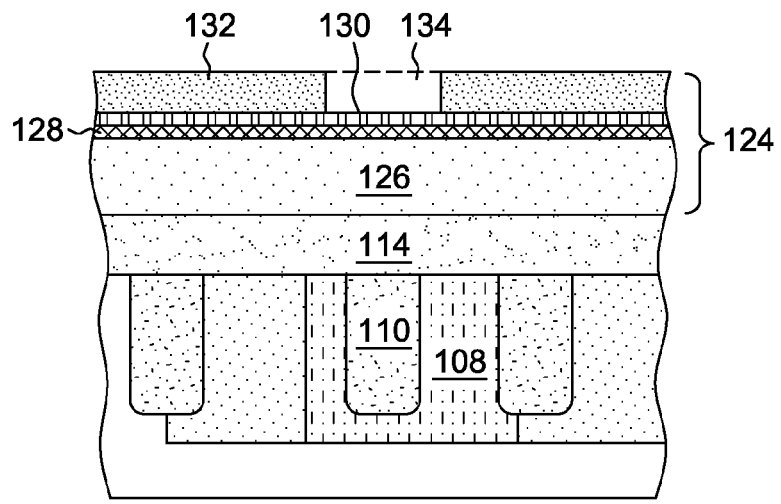
FIG. 2 depicts one example of the starting structure of FIG. 1 after creation of a lithographic stack thereover, the lithographic stack including a bottom layer of a spin-on hard mask (SOH) material, one or more layers of anti-reflective coating materials over the layer of SOH material (in this example, a bottom layer of silicon oxynitride (SiON) and a top layer of a Bottom Anti-Reflective Coating (BARC)), and a top layer of a lithographic blocking material, a portion of the top layer removed above each isolation region, in accordance with one or more aspects of the present invention.

FIG. 2 depicts one example of the starting structure of FIG. 1 after creation of a lithographic stack 124 thereover, the lithographic stack including, for example, a bottom layer 126 of a spin-on hard mask (SOH) material, one or more layers of anti-reflective coating materials over the layer of SOH material (in this example, a bottom layer 128 of silicon oxynitride (SiON) and a top layer 130 of a Bottom Anti-Reflective Coating (BARC)), the stack also including a top layer 132 of a lithographic blocking material (e.g., photoresist), a portion 134 of the top layer having been removed above each isolation region in each drain well (e.g., isolation region 110 in drain well 108), in accordance with one or more aspects of the present invention.

Creation of the lithographic stack 124 and removal of the portion 134 of the top layer 132 may be accomplished, for example, using known processes and techniques. The ultimate purpose of the lithographic stack is, of course, to pattern the layer 114 of hard mask material underneath. In addition, other materials for the lithographic stack could be used, and the number of layers could be different. Any combination of materials in the stack that accomplishes the ultimate purpose could be used.

Figure 3:
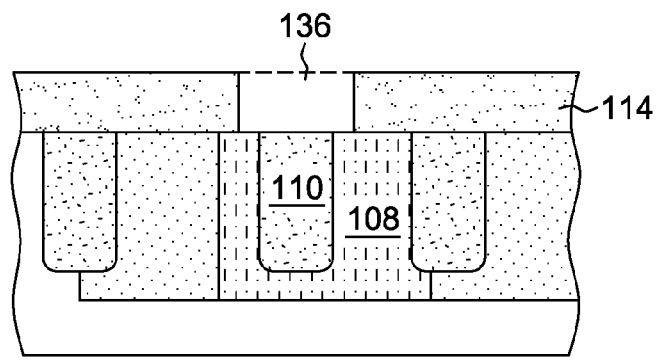
FIG. 3 depicts one example of the structure of FIG. 2 after removal of a portion of the blanket layer of hard mask material over each isolation region via lithography and the removal of the lithographic stack, in accordance with one or more aspects of the present invention.

FIG. 3 depicts one example of the structure of FIG. 2 after removal of a portion 136 of the blanket layer 114 of hard mask material over each isolation region in each drain well (e.g., isolation region 110 in drain well 108) via lithography, and after the removal of the lithographic stack 124, in accordance with one or more aspects of the present invention.

Removal of the lithographic stack takes place after the lithography, and may be accomplished, for example, using known processes and techniques.

Figure 4:
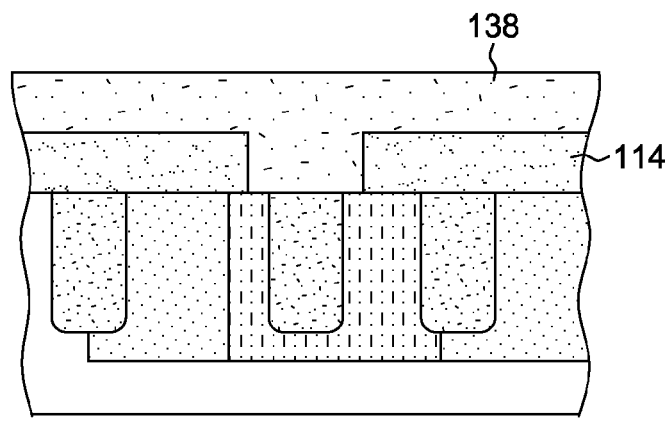
FIG. 4 depicts one example of the structure of FIG. 3 after creation of a blanket conformal layer of isolation material, the blanket conformal layer filling in each opening in the layer of hard mask material, in accordance with one or more aspects of the present invention.

FIG. 4 depicts one example of the structure of FIG. 3 after creation of a blanket conformal layer 138 of isolation material over the layer 114 of hard mask material, the blanket conformal layer filling in each opening in the layer of hard mask material (e.g., opening 136 in FIG. 3), in accordance with one or more aspects of the present invention.

The blanket conformal layer 138 of isolation material may include, for example, an oxide, and may be created using, for example, a high-density plasma (HDP) chemical-vapor deposition.

Figure 5:
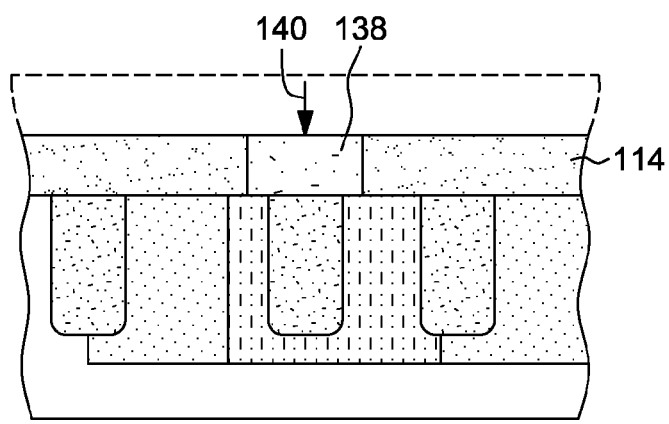
FIG. 5 depicts one example of the structure of FIG. 4 after planarization of the blanket conformal layer of isolation material, stopping on the layer of hard mask material, in accordance with one or more aspects of the present invention.

FIG. 5 depicts one example of the structure of FIG. 4 after planarization 140 of the blanket conformal layer 138 of isolation material, stopping on the layer 114 of hard mask material, in accordance with one or more aspects of the present invention. In one example, the planarization 140 may be accomplished using, for example, a chemical-mechanical polish (CMP) selective to the hard mask material.

Figure 6:
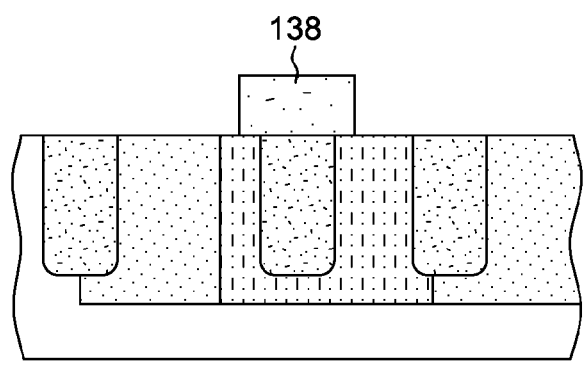
FIG. 6 depicts one example of the structure of FIG. 5 after removal of a remainder of the layer of hard mask material, in accordance with one or more aspects of the present invention.

FIG. 6 depicts one example of the structure of FIG. 5 after removal of a remainder of the layer (114, FIG. 5) of hard mask material, exposing the structure, except for the drain well isolation region(s) covered by isolation layer 138, in accordance with one or more aspects of the present invention. In one example, removal of the remaining hard mask layer may be accomplished using, for example, known processes and techniques.

Figure 7:
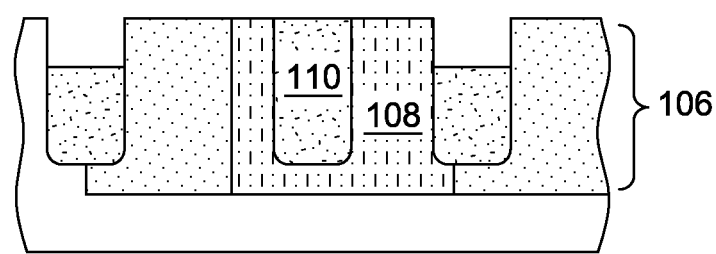
FIG. 7 depicts one example of the structure of FIG. 6 after removal of the isolation material over each isolation region, and exposing sides of the raised structure(s), in accordance with one or more aspects of the present invention.

FIG. 7 depicts one example of the structure of FIG. 6 after removal of the layer 138 of isolation material above each drain well (e.g., drain well 108), and after exposing sides 141 and 143 of raised structure 106 (where the raised structure is a fin, this is also known as "fin reveal"). Note that in practice, at the stage of fabrication in FIG. 7, a small amount of isolation layer 138 may remain above the isolation region 110.

In one example, removal of the layer 138 of isolation material above each drain well can be accomplished using, for example, known processes (e.g., etch processes) and techniques.

Figure 8:
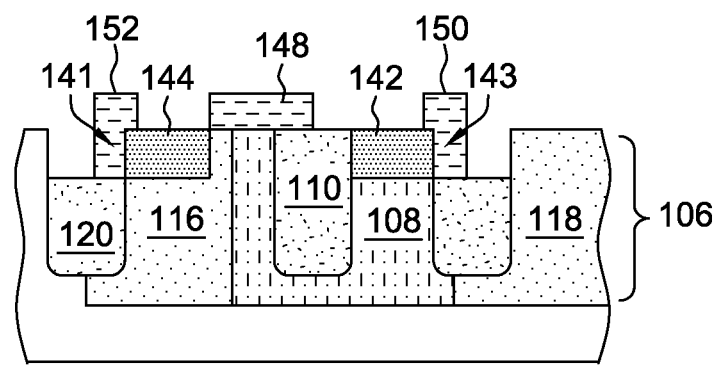
FIG. 8 depicts one example of the structure of FIG. 7 after creation of a drain in each drain well adjacent each isolation region, creation of a three-surface wrap conductive center gate over each raised structure covering a portion of each isolation region, and creation of an edge gate covering an outer edge of each drain, in accordance with one or more aspects of the present invention.

FIG. 8 depicts one example of the structure of FIG. 7 after creation of a drain (e.g., drain 142) in each drain well (e.g., drain well 108) adjacent each isolation region, in accordance with one or more aspects of the present invention, and after creation of a three-surface wrap (versus conventional four-surface wrap) dummy center gate 148 and a dummy edge drain gate 150 (e.g., polysilicon gates) over each raised structure (e.g., raised structure 106), each dummy center gate covering a portion of each isolation region (e.g., isolation region 110) in each drain well (e.g., drain well 108), and each dummy edge drain gate covering an outer edge of each drain.

Creation of dummy gates 148 and 150 may be accomplished, for example, using known processes and techniques. Note that the three-surface wrap of the center gate is achieved by the preservation of the isolation region (e.g., isolation region 110) in each drain well (e.g., drain well 108). Creation of the drain(s) can be accomplished, for example, by implantation of n-type or p-type impurities, depending on the type of semiconductor device being fabricated.

Although not critical for the invention, also shown in FIG. 8 is source 144 and dummy source edge gate 152. In one example, source 144 may be created by implantation of n-type or p-type impurities, opposite that of drain 142, and dummy source edge gate can be created similar to (and, for example, simultaneous with) dummy edge drain gate 150. In another example, source 144 and drain 142 doped silicon may be obtained using, for example, silicon etchback and doped selective epitaxy.

In a first aspect, disclosed above is a non-planar semiconductor structure. The structure includes a semiconductor substrate, raised semiconductor structure(s) coupled to the substrate, a drain well in each of the raised structure(s), and a drain in each drain well. The structure further includes an isolation region in each drain well adjacent the drain, the isolation region reaching to a top surface of the raised structure(s), and a conductive center gate on the raised structure(s), the conductive center gate covering a top surface, a front surface and a back surface thereof, and covering a portion of the isolation region opposite the drain.

In one example, an ending structure of the non-planar semiconductor structure of the first aspect may take the form of, for example, a non-planar lateral drift metal-oxide semiconductor (LDMOS) device. The non-planar LDMOS may further take the form of, for example, a non-planar field-effect transistor.

In one example, the structure of the first aspect may further include, for example, an edge gate covering an outer edge of each drain.

In one example, where the edge gate(s) is present, an ending structure of the non-planar semiconductor structure may include, for example, a non-planar lateral drift metal-oxide semiconductor (LDMOS) device. In one example, the non-planar LDMOS device may include, for example, a non-planar field-effect transistor.

In one example, where the edge gate is present, the non-planar semiconductor structure may further include, for example, a source for each drain, and another edge gate covering an outer edge of each source. In another example, where the source(s) and source edge gate(s) are present, each source and each drain may include, for example, epitaxy, e.g., silicon-based epitaxy, such as, for example, silicon epitaxy, phosphorus-doped silicon epitaxy or silicon germanium epitaxy.

In a second aspect, disclosed above is a non-planar semiconductor structure. The structure includes a semiconductor substrate, raised semiconductor structure(s) coupled to the substrate, a drain well in each of the raised structure (s), and an isolation region in each drain well, the isolation region reaching to a top surface of the raised structure(s). The structure further includes a layer of hard mask material over the raised structure(s), the layer of hard mask material having an opening therein above each isolation region.

In one example, the non-planar semiconductor structure of the second aspect may include, for example, isolation material in each opening of the layer of hard mask material above each isolation region.

In a third aspect, disclosed above is a method. The method includes providing a starting non-planar semiconductor structure. The starting structure includes a semiconductor substrate, raised semiconductor structure(s) coupled to the substrate, a drain well in each raised structure, and an isolation region in each drain well, each isolation region reaching to a top surface of the raised structure. The method further includes preserving the isolation region in each drain well, creating a center gate covering a portion of the raised structure(s) opposite the drain, and creating a drain in each drain well adjacent to the isolation region. The center gate can be, for example, a dummy gate (e.g., polysilicon) later replaced, after creating the drain(s), by a conductive center gate, or the center gate can be, as another example, a conductive center gate (e.g., including tungsten), where a "gate first" process is used.

In one example, preserving the isolation region in each drain well in the method of the third aspect may include, for example, creating a layer of hard mask material over each isolation region in each drain well.

In one example, creating the layer of hard mask material in the method of the third aspect may include, for example, creating a blanket layer of hard mask material over the structure, creating an opening in the layer of hard mask material over each isolation region, filling each opening in the layer of hard mask material with isolation material, and removing a remaining portion of the layer of hard mask material.

In one example, creating an opening in the layer of hard mask material in the method of the third aspect may include, for example, creating a lithographic stack having multiple layers over the layer of hard mask material, the multiple layers including a top layer of lithographic blocking material, removing a portion of the top layer over each isolation region in each drain well, and performing lithography to create an opening in the layer of hard mask material over each isolation region in each drain well.

In one example, the method of the third aspect may further include, for example, creating an edge gate covering an outer edge of each drain.

In one example, where the edge gate(s) is present, the method may further include, for example, creating a source for each drain, and creating another edge gate covering an outer edge of each source.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A non-planar semiconductor structure, comprising:
a semiconductor substrate;
at least one fin coupled to the substrate;
a drain well in each of the at least one fin;
a drain within each drain well, a top surface of the drain being coplanar with a top surface of the at least one fin;
an isolation region in each drain well horizontally adjacent the drain, a top surface of the isolation region being coplanar with a top surface of the drain;
a conductive center gate on the at least one fin, the conductive center gate covering a top surface, a front surface and a back surface thereof, and covering a portion of the isolation region opposite the drain; and
an edge gate covering an outer vertical edge of each drain.

2. The non-planar semiconductor structure of claim 1, wherein an ending structure thereof comprises a non-planar lateral drift metal-oxide semiconductor (LDMOS) device.

3. The non-planar semiconductor structure of claim 2, wherein the non-planar LDMOS comprises a non-planar field-effect transistor.

4. The non-planar semiconductor structure of claim 1, wherein an ending structure thereof comprises a non-planar lateral drift metal-oxide semiconductor (LDMOS) device.

5. The non-planar semiconductor structure of claim 4, wherein the non-planar LDMOS comprises a non-planar field-effect transistor.

6. The non-planar semiconductor structure of claim 1, further comprising:
a source for each drain; and
another edge gate covering an outer edge of each source.

7. The non-planar semiconductor structure of claim 6, wherein each drain and each source comprises silicon-based epitaxy.

* * * * *